(12) United States Patent
Scheuermann

(10) Patent No.: US 7,423,496 B2
(45) Date of Patent: Sep. 9, 2008

(54) RESONATOR WITH ADJUSTABLE CAPACITANCE FOR MEDICAL DEVICE

(75) Inventor: Torsten Scheuermann, Munich (DE)

(73) Assignee: Boston Scientific Scimed, Inc., Maple Grove, MN (US)

( * ) Notice: Subject to any disclaimer, the term of this patent is extended or adjusted under 35 U.S.C. 154(b) by 275 days.

(21) Appl. No.: 11/270,417

(22) Filed: Nov. 9, 2005

(65) Prior Publication Data

US 2007/0106151 A1    May 10, 2007

(51) Int. Cl.
*A61B 5/05* (2006.01)
(52) U.S. Cl. .................. 331/177 V; 600/421; 600/422; 600/423; 324/309; 324/322
(58) Field of Classification Search ......... 128/897, 128/898, 899; 600/410, 420, 421, 422, 423, 600/424, 429, 431, 435; 324/307, 309, 318, 324/322; 331/167, 177 V, 187, 18
See application file for complete search history.

(56) References Cited

U.S. PATENT DOCUMENTS

| | | | |
|---|---|---|---|
| 4,890,063 A | 12/1989 | Haragashira | |
| 5,409,460 A | 4/1995 | Krumme | 604/107 |
| 5,824,045 A | 10/1998 | Alt | 623/1 |
| 5,843,117 A | 12/1998 | Alt et al. | 606/194 |
| 5,855,600 A | 1/1999 | Alt | 623/1 |
| 5,871,437 A | 2/1999 | Alt | 600/3 |
| 6,027,510 A | 2/2000 | Alt | 606/108 |
| 6,053,873 A | 4/2000 | Govari et al. | 600/505 |
| 6,099,561 A | 8/2000 | Alt | 623/1.44 |
| 6,106,473 A | 8/2000 | Violante et al. | 600/458 |
| 6,159,142 A | 12/2000 | Alt | 600/3 |
| 6,159,237 A | 12/2000 | Alt et al. | 623/1.11 |
| 6,231,516 B1 | 5/2001 | Keilman et al. | 600/485 |
| 6,245,104 B1 | 6/2001 | Alt | 623/1.46 |
| 6,251,134 B1 | 6/2001 | Alt et al. | 623/1.16 |
| 6,280,385 B1 | 8/2001 | Melzer et al. | 600/423 |

(Continued)

FOREIGN PATENT DOCUMENTS

DE    10127850    2/2003

(Continued)

OTHER PUBLICATIONS

Venook, Ross D., et al., "Automatic turning of Flexible Inerventional RF Receiver Coils", Magnetic Resonance in Medicince, vol. 54, pp. 983-993 (2005).

(Continued)

*Primary Examiner*—Robert J. Pascal
*Assistant Examiner*—Ryan J. Johnson
(74) *Attorney, Agent, or Firm*—Brooks, Cameron & Huebsch, PLLC

(57) ABSTRACT

Systems and methods for a resonator with an adjustable capacitance for a medical device. In one embodiment, a resonator system includes a resonator device with an LC resonator circuit that has an adjustable capacitance, an inductor coil in series with the adjustable capacitance, and an adjustable capacitance control that can control the adjustable capacitance to obtain different particular capacitance values. This embodiment also includes a medical device, positioned with the resonator device, so that at least a portion of the inductor coil surrounds a space that is surrounded by at least a portion of the medical device.

21 Claims, 6 Drawing Sheets

U.S. PATENT DOCUMENTS

| | | |
|---|---|---|
| 6,304,769 B1 | 10/2001 | Arenson et al. ............. 600/424 |
| 6,385,478 B1 | 5/2002 | Hajnal ........................ 600/410 |
| 6,387,121 B1 | 5/2002 | Alt ............................. 623/1.15 |
| 6,398,805 B1 | 6/2002 | Alt ............................. 623/1.15 |
| 6,416,540 B1 | 7/2002 | Mathur ....................... 623/1.15 |
| 6,463,317 B1 | 10/2002 | Kucharczyk et al. ........ 600/411 |
| 6,478,815 B1 | 11/2002 | Alt ............................. 623/1.15 |
| 6,511,325 B1 | 1/2003 | Lalka et al. .................. 434/272 |
| 6,516,213 B1 | 2/2003 | Nevo ........................... 600/424 |
| 6,574,497 B1 | 6/2003 | Pacetti ........................ 600/420 |
| 6,585,660 B2 | 7/2003 | Dorando et al. ............. 600/486 |
| 6,585,755 B2 | 7/2003 | Jackson et al. .............. 623/1.15 |
| 6,585,763 B1 | 7/2003 | Keilman et al. ............. 623/1.42 |
| 6,628,980 B2 | 9/2003 | Atalar et al. ................. 600/423 |
| 6,652,540 B1 | 11/2003 | Cole et al. ................... 606/153 |
| 6,663,570 B2 | 12/2003 | Mott et al. ................... 600/486 |
| 6,668,197 B1 | 12/2003 | Habib et al. ................. 607/101 |
| 6,673,104 B2 | 1/2004 | Barry .......................... 623/1.15 |
| 6,676,694 B1 | 1/2004 | Weiss .......................... 623/1.11 |
| 6,702,847 B2 | 3/2004 | DiCarlo ....................... 623/1.34 |
| 6,711,429 B1 | 3/2004 | Gilboa et al. ................ 600/407 |
| 6,711,440 B2 | 3/2004 | Deal et al. ...................... 607/9 |
| 6,712,844 B2 | 3/2004 | Pacetti ........................ 623/1.15 |
| 6,716,237 B1 | 4/2004 | Alt ............................. 623/1.11 |
| 6,718,203 B2 | 4/2004 | Weiner et al. ................... 607/2 |
| 6,718,207 B2 | 4/2004 | Connelly ........................ 607/9 |
| 6,725,092 B2 | 4/2004 | MacDonald et al. ............ 607/2 |
| 6,731,979 B2 | 5/2004 | MacDonald .................... 607/9 |
| 6,757,566 B2 | 6/2004 | Weiner et al. ............... 607/116 |
| 6,760,628 B2 | 7/2004 | Weiner et al. ............... 607/122 |
| 6,763,268 B2 | 7/2004 | MacDonald et al. ........... 607/9 |
| 6,765,144 B1 | 7/2004 | Wang et al. ................... 174/36 |
| 6,767,360 B1 | 7/2004 | Alt et al. ..................... 623/1.15 |
| 6,778,856 B2 | 8/2004 | Connelly et al. ............... 607/32 |
| 6,782,284 B1 | 8/2004 | Subramanyan et al. ...... 600/407 |
| 6,785,572 B2 | 8/2004 | Yanof et al. ................. 600/427 |
| 6,786,904 B2 | 9/2004 | Döscher et al. ............... 606/28 |
| 6,787,777 B1 | 9/2004 | Gagnon et al. ......... 250/363.04 |
| 6,788,827 B1 | 9/2004 | Makram-Ebeid ............ 382/276 |
| 6,790,182 B2 | 9/2004 | Eck et al. .................... 600/447 |
| 6,795,730 B2 | 9/2004 | Connelly et al. ................ 607/9 |
| 6,795,736 B2 | 9/2004 | Connelly et al. ............... 607/36 |
| 6,799,069 B2 | 9/2004 | Weiner et al. ................... 607/3 |
| 6,802,811 B1 | 10/2004 | Slepian ....................... 600/309 |
| 6,802,857 B1 | 10/2004 | Walsh et al. ................. 623/1.15 |
| 6,808,535 B1 | 10/2004 | Jordan ........................ 623/1.34 |
| 6,819,954 B2 | 11/2004 | Connelly ....................... 607/27 |
| 6,819,958 B2 | 11/2004 | Weiner et al. ............... 607/116 |
| 6,829,509 B1 | 12/2004 | MacDonald et al. ........ 607/119 |
| 6,844,492 B1 | 1/2005 | Wang et al. ................... 174/36 |
| 6,845,266 B2 | 1/2005 | Weiner et al. ................... 607/2 |
| 6,847,837 B1 | 1/2005 | Melzer et al. ................ 600/421 |
| 6,850,804 B2 | 2/2005 | Eggers et al. ................ 607/103 |
| 6,850,805 B2 | 2/2005 | Connelly et al. ............. 607/122 |
| 6,875,180 B2 | 4/2005 | Weiner et al. ............... 600/508 |
| 6,884,234 B2 | 4/2005 | Aita et al. ............... 604/103.01 |
| 6,892,090 B2 | 5/2005 | Verard et al. ................ 600/424 |
| 6,898,454 B2 | 5/2005 | Atalar et al. ................. 600/410 |
| 6,901,290 B2 | 5/2005 | Foster et al. .................... 607/9 |
| 6,908,468 B2 | 6/2005 | Daum .......................... 606/76 |
| 6,925,322 B2 | 8/2005 | Helfer et al. ................. 600/423 |
| 6,925,328 B2 | 8/2005 | Foster et al. .................... 607/9 |
| 6,954,674 B2 | 10/2005 | Connelly ...................... 607/63 |
| 6,957,098 B1 | 10/2005 | Hyde et al. .................. 600/424 |
| 2001/0031919 A1 | 10/2001 | Strommer et al. ........... 600/424 |
| 2001/0031920 A1 | 10/2001 | Kaufman et al. ............ 600/431 |
| 2002/0019660 A1 | 2/2002 | Gianotti et al. .............. 623/1.15 |
| 2002/0026230 A1 | 2/2002 | Moll et al. ................... 623/1.13 |
| 2002/0040815 A1 | 4/2002 | Van Vaals ................... 600/411 |
| 2002/0042637 A1 | 4/2002 | Stover |
| 2002/0045816 A1 | 4/2002 | Atalar et al. ................. 600/423 |
| 2002/0049375 A1 | 4/2002 | Strommer et al. ........... 600/407 |
| 2002/0082679 A1 | 6/2002 | Sirhan et al. ................ 623/1.15 |
| 2002/0082685 A1 | 6/2002 | Sirhan et al. ................ 623/1.42 |
| 2002/0137014 A1 | 9/2002 | Anderson et al. ........... 434/262 |
| 2002/0173724 A1 | 11/2002 | Dorando et al. ............. 600/486 |
| 2002/0188345 A1 | 12/2002 | Pacetti ........................ 623/1.15 |
| 2003/0004562 A1 | 1/2003 | DiCarlo ...................... 623/1.13 |
| 2003/0004563 A1 | 1/2003 | Jackson et al. .............. 623/1.15 |
| 2003/0074049 A1 | 4/2003 | Hoganson et al. ........... 623/1.13 |
| 2003/0083579 A1 | 5/2003 | Aita et al. .................... 600/470 |
| 2003/0087244 A1 | 5/2003 | McCarthy ...................... 435/6 |
| 2003/0088178 A1 | 5/2003 | Owens et al. ................ 600/420 |
| 2003/0088308 A1 | 5/2003 | Scheuermann et al. ..... 623/1.15 |
| 2003/0092013 A1 | 5/2003 | McCarthy et al. ............... 435/6 |
| 2003/0096248 A1 | 5/2003 | McCarthy et al. ............... 435/6 |
| 2003/0099957 A1 | 5/2003 | McCarthy ...................... 435/6 |
| 2003/0100830 A1 | 5/2003 | Zhong et al. ................ 600/431 |
| 2003/0105069 A1 | 6/2003 | Robinson et al. ............ 514/185 |
| 2003/0139739 A1 | 7/2003 | Doscher et al. ............... 606/28 |
| 2003/0143544 A1 | 7/2003 | McCarthy ...................... 435/6 |
| 2003/0144728 A1 | 7/2003 | Scheuermann et al. ..... 623/1.15 |
| 2003/0163052 A1 | 8/2003 | Mott et al. ................... 600/486 |
| 2003/0187335 A1 | 10/2003 | McCarthy .................... 600/300 |
| 2003/0199747 A1 | 10/2003 | Michlitsch et al. .......... 600/407 |
| 2003/0212448 A1 | 11/2003 | Smith ......................... 623/1.13 |
| 2004/0010304 A1 | 1/2004 | Weber et al. ................ 623/1.11 |
| 2004/0019376 A1 | 1/2004 | Alt ............................. 623/1.42 |
| 2004/0030379 A1 | 2/2004 | Hamm et al. ............... 623/1.15 |
| 2004/0034300 A1 | 2/2004 | Verard et al. ................ 600/424 |
| 2004/0038406 A1 | 2/2004 | Unger et al. ................. 435/459 |
| 2004/0039438 A1 | 2/2004 | Alt ............................. 623/1.15 |
| 2004/0044397 A1 | 3/2004 | Stinson ....................... 623/1.15 |
| 2004/0059280 A1 | 3/2004 | Makower et al. ................ 604/8 |
| 2004/0082866 A1 | 4/2004 | Mott et al. ................... 600/486 |
| 2004/0091603 A1 | 5/2004 | Priewe ...................... 427/2.24 |
| 2004/0093075 A1 | 5/2004 | Kuehne ...................... 623/1.15 |
| 2004/0097804 A1 | 5/2004 | Sobe ........................... 600/424 |
| 2004/0097805 A1 | 5/2004 | Verard et al. ................ 600/428 |
| 2004/0098093 A1 | 5/2004 | DiCarlo ...................... 623/1.13 |
| 2004/0111016 A1 | 6/2004 | Casscells, III et al. ....... 600/310 |
| 2004/0116997 A1 | 6/2004 | Taylor et al. ................ 623/1.11 |
| 2004/0117007 A1 | 6/2004 | Whitbourne et al. ........ 623/1.42 |
| 2004/0122494 A1 | 6/2004 | Eggers et al. ................ 607/103 |
| 2004/0143180 A1 | 7/2004 | Zhong et al. ................ 600/410 |
| 2004/0158310 A1 | 8/2004 | Weber et al. ................ 623/1.15 |
| 2004/0186377 A1 | 9/2004 | Zhong et al. ................ 600/431 |
| 2004/0210289 A1 | 10/2004 | Wang et al. ................. 607/116 |
| 2004/0230271 A1 | 11/2004 | Wang et al. ................. 607/116 |
| 2004/0243220 A1 | 12/2004 | Gianotti et al. .............. 623/1.15 |
| 2004/0249428 A1 | 12/2004 | Wang et al. ................. 607/116 |
| 2004/0254419 A1 | 12/2004 | Wang et al. ..................... 600/8 |
| 2004/0254632 A1 | 12/2004 | Alt et al. ..................... 623/1.15 |
| 2005/0004653 A1 | 1/2005 | Gerberding et al. ......... 623/1.13 |
| 2005/0025797 A1 | 2/2005 | Wang et al. ................. 424/422 |
| 2005/0033407 A1 | 2/2005 | Weber et al. ................ 623/1.15 |
| 2005/0049480 A1 | 3/2005 | Gray .......................... 600/407 |
| 2005/0049481 A1 | 3/2005 | Gray et al. .................. 600/407 |
| 2005/0049482 A1 | 3/2005 | Gray et al. .................. 600/407 |
| 2005/0049683 A1 | 3/2005 | Gray et al. .................. 623/1.15 |
| 2005/0049684 A1 | 3/2005 | Gray et al. .................. 623/1.15 |
| 2005/0049685 A1 | 3/2005 | Gray et al. .................. 623/1.15 |
| 2005/0049686 A1 | 3/2005 | Gray et al. .................. 623/1.15 |
| 2005/0049688 A1 | 3/2005 | Gray et al. .................. 623/1.16 |
| 2005/0049689 A1 | 3/2005 | Gray et al. .................. 623/1.16 |
| 2005/0065430 A1 | 3/2005 | Wiethoff et al. ............. 600/413 |
| 2005/0065437 A1 | 3/2005 | Weber et al. ................ 600/431 |
| 2005/0079132 A1 | 4/2005 | Wang et al. ................. 424/1.11 |
| 2005/0080459 A1 | 4/2005 | Jacobson et al. ................ 607/9 |
| 2005/0085895 A1 | 4/2005 | Brown et al. ................ 623/1.15 |
| 2005/0090886 A1 | 4/2005 | MacDonald et al. ........ 607/122 |
| 2005/0107870 A1 | 5/2005 | Wang et al. ................. 623/1.44 |
| 2005/0113669 A1 | 5/2005 | Helfer et al. ................. 600/412 |
| 2005/0113676 A1 | 5/2005 | Weiner et al. ............... 600/421 |

| | | | | | | |
|---|---|---|---|---|---|---|
| 2005/0113873 A1 | 5/2005 | Weiner et al. ............... 607/2 | 2005/0183731 A1 | 8/2005 | Hunter et al. ............... 128/898 |
| 2005/0113874 A1 | 5/2005 | Connelly et al. ............ 607/2 | 2005/0186239 A1 | 8/2005 | Hunter et al. ............... 424/422 |
| 2005/0113876 A1 | 5/2005 | Weiner et al. .............. 607/36 | 2005/0186244 A1 | 8/2005 | Hunter et al. ............... 424/423 |
| 2005/0131522 A1 | 6/2005 | Stinson et al. ............ 623/1.15 | 2005/0186245 A1 | 8/2005 | Hunter et al. ............... 424/423 |
| 2005/0143651 A1 | 6/2005 | Verard et al. ............... 600/424 | 2005/0187140 A1 | 8/2005 | Hunter et al. ............... 514/2 |
| 2005/0149002 A1 | 7/2005 | Wang et al. ................. 606/1 | 2005/0187582 A1 | 8/2005 | Weiner ........................ 607/4 |
| 2005/0149157 A1 | 7/2005 | Hunter et al. ............... 607/119 | 2005/0187600 A1 | 8/2005 | Hunter et al. ............... 607/115 |
| 2005/0149169 A1 | 7/2005 | Wang et al. ................. 623/1.15 | 2005/0192647 A1 | 9/2005 | Hunter et al. ............... 607/57 |
| 2005/0152946 A1 | 7/2005 | Hunter et al. ............... 424/423 | 2005/0196421 A1 | 9/2005 | Hunter et al. ............... 424/423 |
| 2005/0154374 A1 | 7/2005 | Hunter et al. ............... 604/890.1 | 2005/0208095 A1 | 9/2005 | Hunter et al. ............... 424/423 |
| 2005/0155779 A1 | 7/2005 | Wang et al. ................. 174/35 | 2005/0209664 A1 | 9/2005 | Hunter et al. ............... 607/115 |
| 2005/0158356 A1 | 7/2005 | Hunter et al. ............... 424/423 | 2005/0209665 A1 | 9/2005 | Hunter et al. ............... 607/115 |
| 2005/0159661 A1 | 7/2005 | Connelly et al. ............ 600/410 | 2005/0209666 A1 | 9/2005 | Hunter et al. ............... 607/115 |
| 2005/0165470 A1 | 7/2005 | Weber ........................ 623/1.15 | 2005/0215764 A1 | 9/2005 | Tuszynski et al. ............ 530/358 |
| 2005/0165471 A1 | 7/2005 | Wang et al. ................. 623/1.15 | 2005/0216075 A1 | 9/2005 | Wang et al. ................. 623/1.15 |
| 2005/0169960 A1 | 8/2005 | Hunter et al. ............... 424/423 | 2005/0277844 A1 * | 12/2005 | Strother et al. ............... 600/546 |
| 2005/0169961 A1 | 8/2005 | Hunter et al. ............... 424/423 | | | |
| 2005/0175664 A1 | 8/2005 | Hunter et al. ............... 424/423 | | | |
| 2005/0175665 A1 | 8/2005 | Hunter et al. ............... 424/423 | | | |
| 2005/0175703 A1 | 8/2005 | Hunter et al. ............... 424/486 | | | |
| 2005/0178395 A1 | 8/2005 | Hunter et al. ............... 128/898 | | | |
| 2005/0178396 A1 | 8/2005 | Hunter et al. ............... 128/898 | | | |
| 2005/0178584 A1 | 8/2005 | Wang et al. ................. 174/256 | | | |
| 2005/0181005 A1 | 8/2005 | Hunter et al. ............... 424/422 | | | |
| 2005/0181009 A1 | 8/2005 | Hunter et al. ............... 424/423 | | | |
| 2005/0181010 A1 | 8/2005 | Hunter et al. ............... 424/423 | | | |
| 2005/0182450 A1 | 8/2005 | Hunter et al. ............... 607/36 | | | |
| 2005/0182463 A1 | 8/2005 | Hunter et al. ............... 607/115 | | | |
| 2005/0182467 A1 | 8/2005 | Hunter et al. ............... 607/116 | | | |
| 2005/0182468 A1 | 8/2005 | Hunter et al. ............... 607/116 | | | |
| 2005/0182469 A1 | 8/2005 | Hunter et al. ............... 607/116 | | | |

FOREIGN PATENT DOCUMENTS

| | | |
|---|---|---|
| EP | 0144405 | 8/1984 |
| JP | 05209948 A * | 8/1993 |
| WO | WO 9919739 A1 * | 4/1999 |
| WO | WO 99/42039 | 8/1999 |
| WO | WO 99/42176 | 8/1999 |
| WO | WO 01/74241 | 10/2001 |
| WO | WO 02/094339 | 11/2002 |

OTHER PUBLICATIONS

International Search Report (Feb. 23, 2007) (7 pgs.).

* cited by examiner

RESONATOR WITH ADJUSTABLE CAPACITANCE FOR MEDICAL DEVICE

FIELD OF THE DISCLOSURE

The present disclosure relates generally to medical devices, medical device systems, and medical device methods; and more particularly to medical devices, medical device systems, and medical device methods for use during magnetic resonance imaging.

BACKGROUND

Magnetic resonance imaging (MRI) can create images of internal aspects of structures by using magnetic fields of various field strengths. When performing MRI, sometimes it is desirable to enhance the visualization of a particular aspect of a structure or an object within a structure, for better signal-to-noise ratios in MRI images. For instance, sometimes it is desirable to enhance the visualization of a medical device when performing an MRI.

One way to enhance visualization when performing MRI is to use a resonator device. An LC circuit can form a basis for a resonator device. An LC circuit with a fixed inductance and a fixed capacitance can resonate at a particular frequency. However, an MRI can use magnetic fields with a range of field strengths to cause material in a structure or an object to resonate over a range of frequencies. Thus, a resonator device with a fixed inductance and a fixed capacitance may not resonate over a range of frequencies.

BRIEF DESCRIPTION OF THE DRAWINGS

The illustrations provided in the Figures may not be to scale.

DETAILED DESCRIPTION

Figure 1:
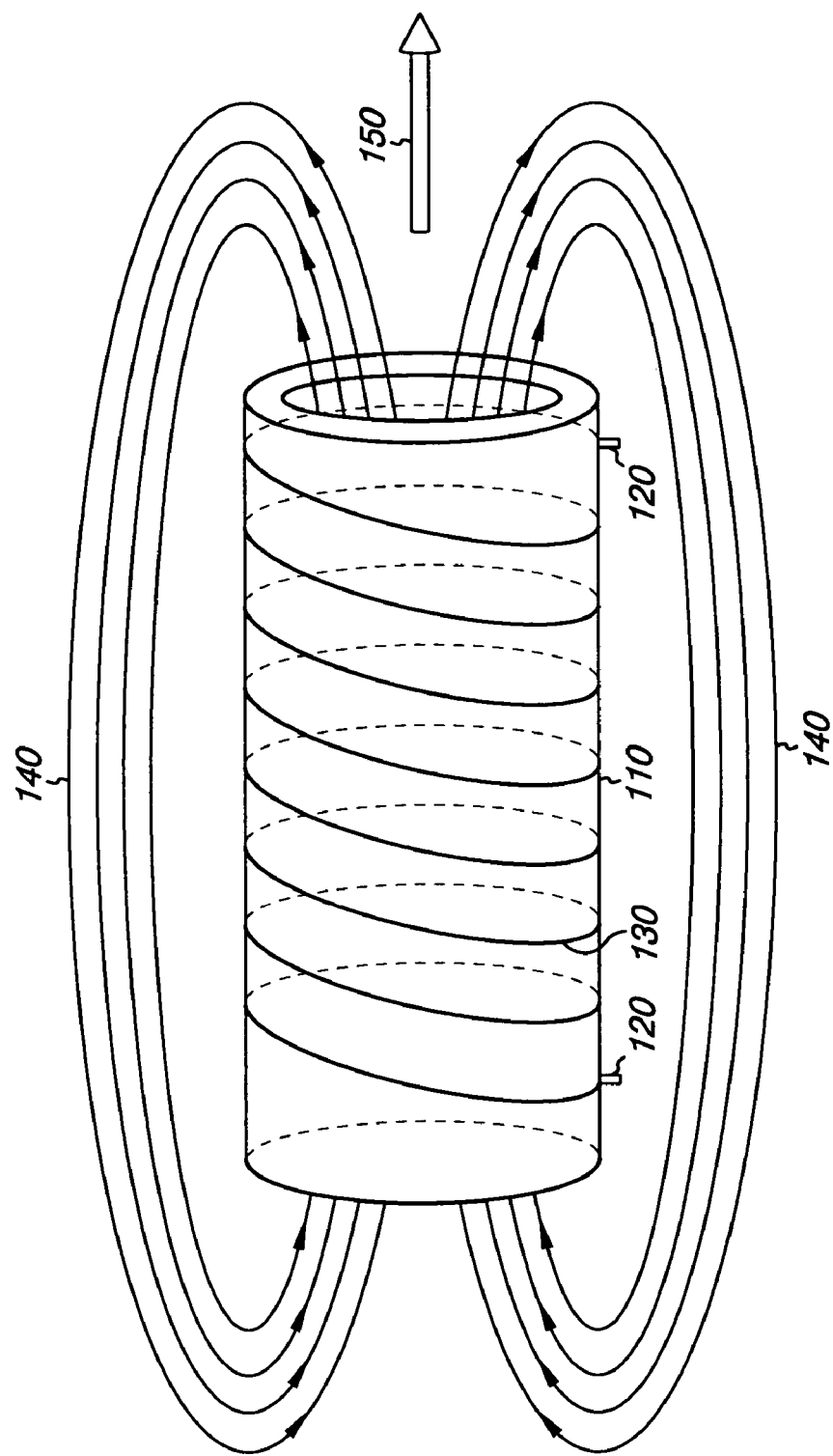
FIG. 1 illustrates an exemplary embodiment of an MRI machine and a static magnetic field.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments. In addition, discussion of features and/or attributes for an element with respect to one figure can also apply to the element shown in one or more additional figures.

Embodiments of the present disclosure are directed to resonator devices, resonator systems, and methods of using the resonator devices. Generally, a resonator device can be used in conjunction with a medical device, including a deliverable device, deliverable in a lumen of a body. One embodiment of the present disclosure includes a resonator with an adjustable capacitance for a medical device, which can enhance visualization when performing MRI.

FIG. 1 illustrates an exemplary embodiment of an MRI machine and a static magnetic field. FIG. 1 is intended to illustrate basic concepts of an MRI machine and is not intended to show details of an MRI machine or to illustrate a particular MRI machine. FIG. 1 includes an MRI scanner 110 with a coil 130 and terminals 120. FIG. 1 also includes static magnetic field lines 140 and a magnetic field vector 150.

The MRI scanner 110 is a cylindrical tube. The coil 130 is electrically conductive. The coil 130 begins at one terminal 120, winds around the MRI scanner 110 in helical form, and ends at another terminal 120. Each terminal 120 is connected to the coil 130 so that electrical current can flow from the terminal 120 through the coil 130.

When electrical current flows through the coil 130 it can create a static magnetic field, which is represented by the static magnetic field lines 140. Each of the static magnetic field lines 140 has a direction, which is represented by arrows. The direction of the magnetic field lines 140 can depend upon the direction in which electrical current flows through the coil 130.

The static magnetic field also has a magnetic field vector 150. The magnetic field vector 150 coincides with a central axis of the MRI scanner 110. The magnetic field vector 150 also has a direction which can depend upon the direction in which electrical current flows through the coil 130. In MRI, the static magnetic field can cause hydrogen protons within the field to align with the magnetic field vector 150. The magnetic field vector 150 can also serve as a reference direction when performing MRI, as described in FIGS. 2A and 2B.

Figure 2A:
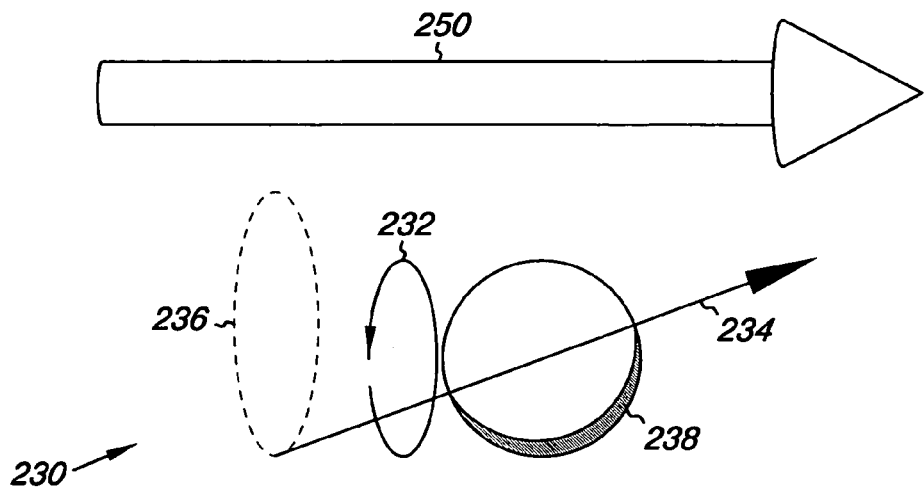
FIG. 2A illustrates an exemplary embodiment of a hydrogen proton in a static magnetic field of an MRI machine.

FIG. 2A illustrates an exemplary embodiment of a hydrogen proton in a static magnetic field of an MRI machine. FIG. 2A includes a magnetic field vector 250 and an illustration of a precessing hydrogen proton 230. The magnetic field vector 250 corresponds with a static magnetic field of an MRI machine, such as the static magnetic field of FIG. 1. The illustration of the precessing hydrogen proton 230 includes a hydrogen proton 238, a spin direction 232, a reference arrow 234, and a reference circle 236.

The presence of the static magnetic field causes the hydrogen proton 238 to precess in the spin direction 232. The hydrogen proton 238 precesses in the spin direction 232 around an axis that is parallel to the magnetic field vector 250. The reference arrow 234 indicates that the precessing of the hydrogen proton 238 creates the reference circle 236. The magnetic field vector 250 is perpendicular to the reference circle 236.

Figure 2B:
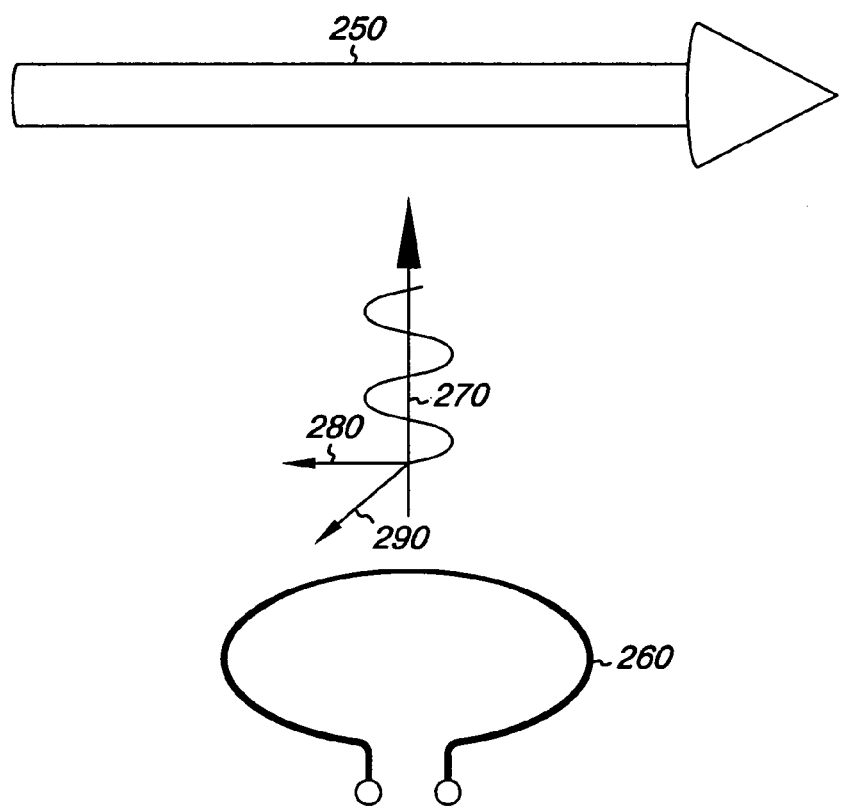
FIG. 2B illustrates an exemplary embodiment of a radio frequency pulse in relation to a static magnetic field of an MRI machine.

FIG. 2B illustrates an exemplary embodiment of a radio frequency pulse in relation to a static magnetic field of an MRI machine. FIG. 2B includes a magnetic field vector 250, a transmitter coil 260, a radio frequency (RF) pulse 270, an RF pulse magnetic field vector 280, and an RF pulse electrical field vector 290. The magnetic field vector 250 corresponds with a static magnetic field of an MRI machine, such as the static magnetic field of FIG. 1. The transmitter coil 260 can be part of the MRI machine and can create the RF pulse 270.

The RF pulse 270 can be an oscillating electro-magnetic field, propagating in a direction perpendicular to the magnetic field vector 250. The RF pulse 270 includes the RF pulse magnetic field vector 280 and the RF pulse electrical field vector 290. RF pulse magnetic field vector 280 and the RF pulse electrical field vector 290 can be perpendicular to each other and perpendicular to the direction in which the RF pulse 270 propagates.

An MRI machine can create an RF pulse at a certain frequency called the Larmor frequency. The Larmor frequency is a frequency at which certain protons resonate. The Larmor frequency differs for protons of different elements and for static magnetic fields of different strengths. Many MRI machines create RF pulses for hydrogen protons, and this is assumed throughout this document unless otherwise indicated. For hydrogen protons, the Larmor frequency is 42.9 MHz for each Tesla of static magnetic field strength.

Some MRI machines can create static magnetic fields with flux ranging from 0.3 Teslas to 7.0 Teslas. Many MRI machines create static magnetic fields with flux ranging from 1.5 Teslas to 3.0 Teslas. Thus, MRI machines that create static magnetic fields with flux between 0.3 and 7.0 Teslas operate at Larmor frequencies between 13 and 300 MHz. Similarly, MRI machines that create static magnetic fields with flux between 1.5 and 3.0 Teslas operate at Larmor frequencies between 64 and 129 MHz.

In MRI, a resonator device can enhance visualization of images by resonating at the Larmor frequency. In some instances, a resonator device can enhance visualization of images by resonating at a frequency close to a Larmor frequency, depending on the frequency response of the device. A resonator device based on an LC circuit with a fixed inductance and a fixed capacitance may not resonate over a range of frequencies. Additionally, an inductance of an LC circuit may change under certain conditions or may change in certain applications, such as an inductor coil with a radius that changes when used with an expandable stent. As examples, a resonator device can be used with a balloon expandable stent or a self-expandable stent. However, a resonator device with an adjustable capacitance can resonate over a range of frequencies, as described in FIGS. 3A and 3B.

Figure 3A:
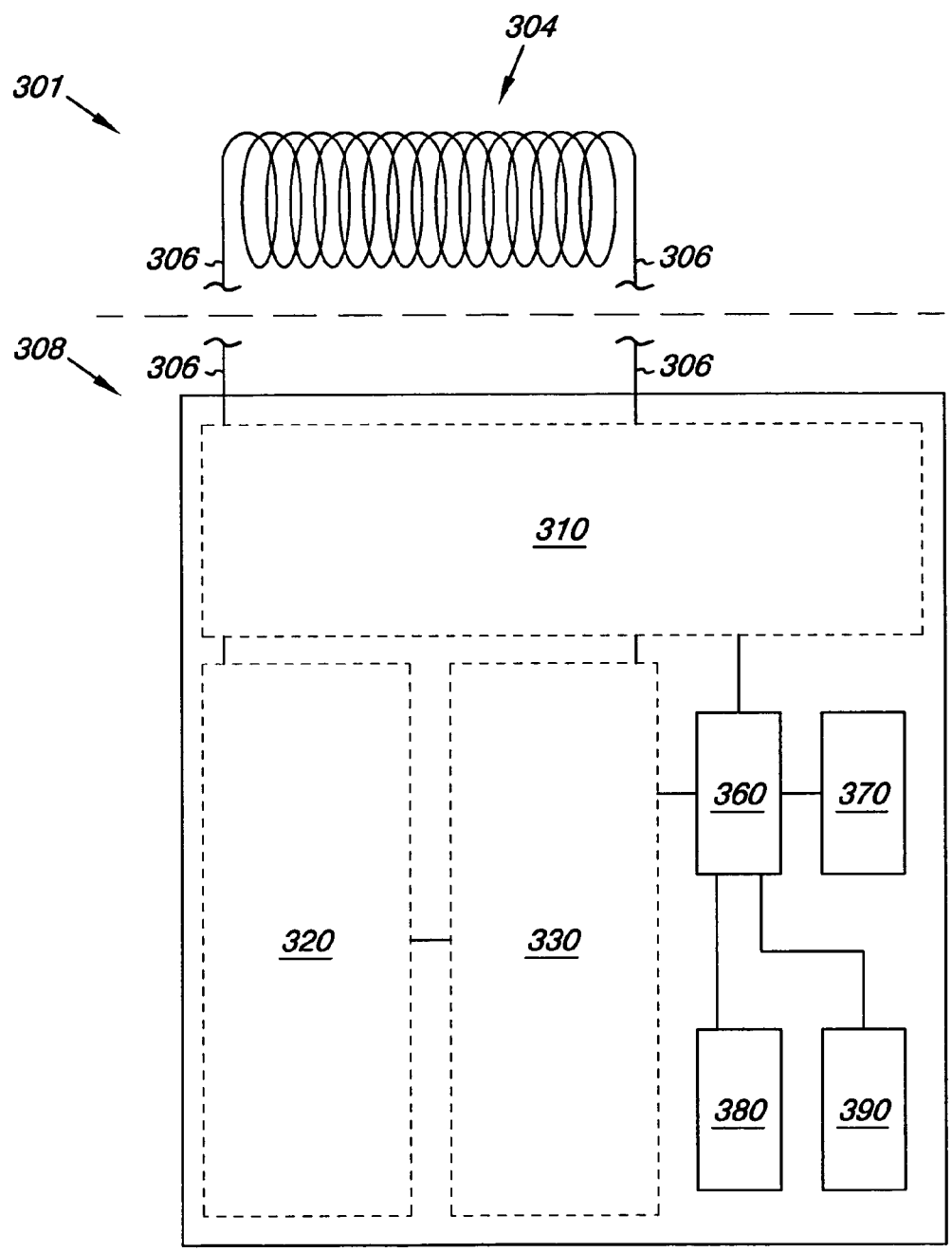
FIG. 3A illustrates an embodiment of a resonator device with an adjustable capacitance according to the present disclosure.

FIG. 3A illustrates an embodiment of a resonator device with an adjustable capacitance according to the present disclosure. In FIG. 3A the resonator device 301 includes an inductor coil 304, connecting conductors 306, and a circuit package 308. The connecting conductors 306 are shown as broken lines to indicate that the inductor coil 304 and the circuit package 308 as shown, may have different scales. The sizes of elements in the FIG. 3A are merely illustrative and are not intended to indicate any particular size or relationship in size.

The inductor coil 304 is external to the circuit package 308, in the resonator device 301. The circuit package 308 encapsulates electrical components, including sensors 310, an adjustable capacitance 320, and an adjustable capacitance control 330. The inductor coil 304, the connecting conductors 306, at least a portion of the adjustable capacitance 320, and at least a portion of the adjustable capacitance control 330 together form an LC resonator circuit. In the resonator device 301, the circuit package also encapsulates a processor 360, a memory, 370, a power source 380, and a selector 390, which relate to the LC resonator circuit, as described herein.

In the embodiment of FIG. 3A, the adjustable capacitance 320 can have different particular capacitance values. The adjustable capacitance 320, as a whole, is electrically in series with the inductor coil 304. In other words, the inductor coil 304 and the adjustable capacitance 320 respectively form L and C components of the LC resonator circuit, as will be understood by one of ordinary skill in the art. The adjustable capacitance 320 is electrically connected to the adjustable capacitance control 330.

In the resonator device 301 of FIG. 3A, the processor 360 is connected to the LC resonator circuit through the adjustable capacitance control 330. The processor 360 executes logic and/or program instructions that allow it to perform functions, including a function of adjusting the adjustable capacitance 320 by directing the adjustable capacitance control 330. The processor 360 directs the adjustable capacitance control 330 to control the adjustable capacitance 320 to obtain different particular capacitance values. Since the processor 360 directs the adjustable capacitance control 330, in various embodiments, the processor 360 can also be considered as part of the adjustable capacitance control 330. The processor 360 is also connected to the sensors 310. For simplicity, FIG. 3A does not show details of the sensors 310, the adjustable capacitance 320, or the adjustable capacitance control 330. These details are described in FIG. 3B.

In the resonator device 301, the processor 360 is also connected to the memory 370, the power source 380, and the selector 390. The memory 370 can store data which can be used by the processor 360. The processor 360 can communicate with the memory 370 through its connection to the memory 370. The power source 380 can provide the processor 360 with electrical power so the processor 360 can perform its functions, as described in FIG. 2. The selector 390 can be set to different settings, which represent various user inputs, as described herein.

The power source 380 can have different forms in various embodiments. In one embodiment, the power source 380 can generate electrical power from an electro-magnetic field. As examples, the power source 380 can be the inductor coil 304, another conducting coil, or a secondary resonator circuit. In this embodiment, the powering electro-magnetic field can be an RF pulse from an MRI machine or some other field. In various embodiments, an RF pulse can provide power over longer distances. In one embodiment, the power source 380 can be a battery or a rechargeable capacitor. In various embodiments, the power source 380 can also generate electrical power from an alternating magnetic field, such as a field within a transformer, for powering by induction over shorter distances.

In one embodiment, the processor 360 of FIG. 3A automatically adjusts the adjustable capacitance 320 of the LC resonator circuit to a resonant capacitance, in response to an RF pulse from an MRI machine. The processor 360 performs this automatic adjustment by determining a resonant capacitance and then adjusting the adjustable capacitance 320 to the resonant capacitance. As described herein, the resonant capacitance is a capacitance at which the LC resonator circuit will resonate in response to the RF pulse, as will be understood by one of ordinary skill in the art. The processor 360 directs this adjustment in various ways by executing logic and/or program instructions in response to known, sensed, and/or calculated values, as described in FIG. 3B.

A range of adjustable capacitance for an LC resonator circuit of a resonating device can be estimated, based upon a potential range of MRI Larmor frequencies of and an estimated range of inductor coil inductances. A potential range of MRI Larmor frequencies can be determined as described above. An estimated range of inductor coil inductances can be estimated by mathematically modeling an ideal inductance coil.

An inductance for an ideal inductance coil can be mathematically modeled by using an ideal inductor formula. In that formula, $L=(\mu*N^2*\pi*r^2)/l$ where L is inductance in Henries, $\mu$ is a factor equal to $1.26\times10^{-7}$ Henries per meter, N is a number of windings in an inductor coil, r is a radius of the inductor coil in meters, and l is a length of the inductor coil in meters. For example, the ideal inductor formula can be used to mathematically model an inductance for an ideal inductor coil sized to match various dimensions of a stent. In this example a stent can range in radius from 0.001 meters to 0.005 meters and in length from 0.008 meters to 0.07 meters. Also in this example, an inductor can have 1 winding for every 0.001 meter of inductor length or 1 winding for every 0.002 meter of inductor length. Using these example numbers for an ideal inductance coil yields an estimated range of inductor coil inductances from 0.79 nanoHenries to 0.69 microHenries.

A range of adjustable capacitance for an LC resonator circuit of a resonating device can be estimated, based upon a potential range of MRI Larmor frequencies, a potential range of inductor coil inductances and an LC circuit resonance formula. In the LC circuit resonance formula, $f=1/(2*\pi*\sqrt{(L*C)})$ where f is a resonant frequency of the LC resonator circuit, L is an inductance of the LC resonator circuit at the resonant frequency, and C is the capacitance of the LC resonator circuit at the resonant frequency. Since a potential range of MRI Larmor frequencies can be determined and a range of inductor coil inductances can be estimated, as described herein, the LC circuit resonance formula can be solved for a range of adjustable capacitance. As an example, using a potential range of MRI Larmor frequencies from 13 to 300 MHz and a potential range of inductor coil inductances from 0.79 nanoHenries to 0.69 microHenries in the LC circuit resonance formula yields an estimated range of adjustable capacitance from 0.41 picoFarads to 0.19 microFarads, which can be created as described in FIG. 3B.

Figure 3B:
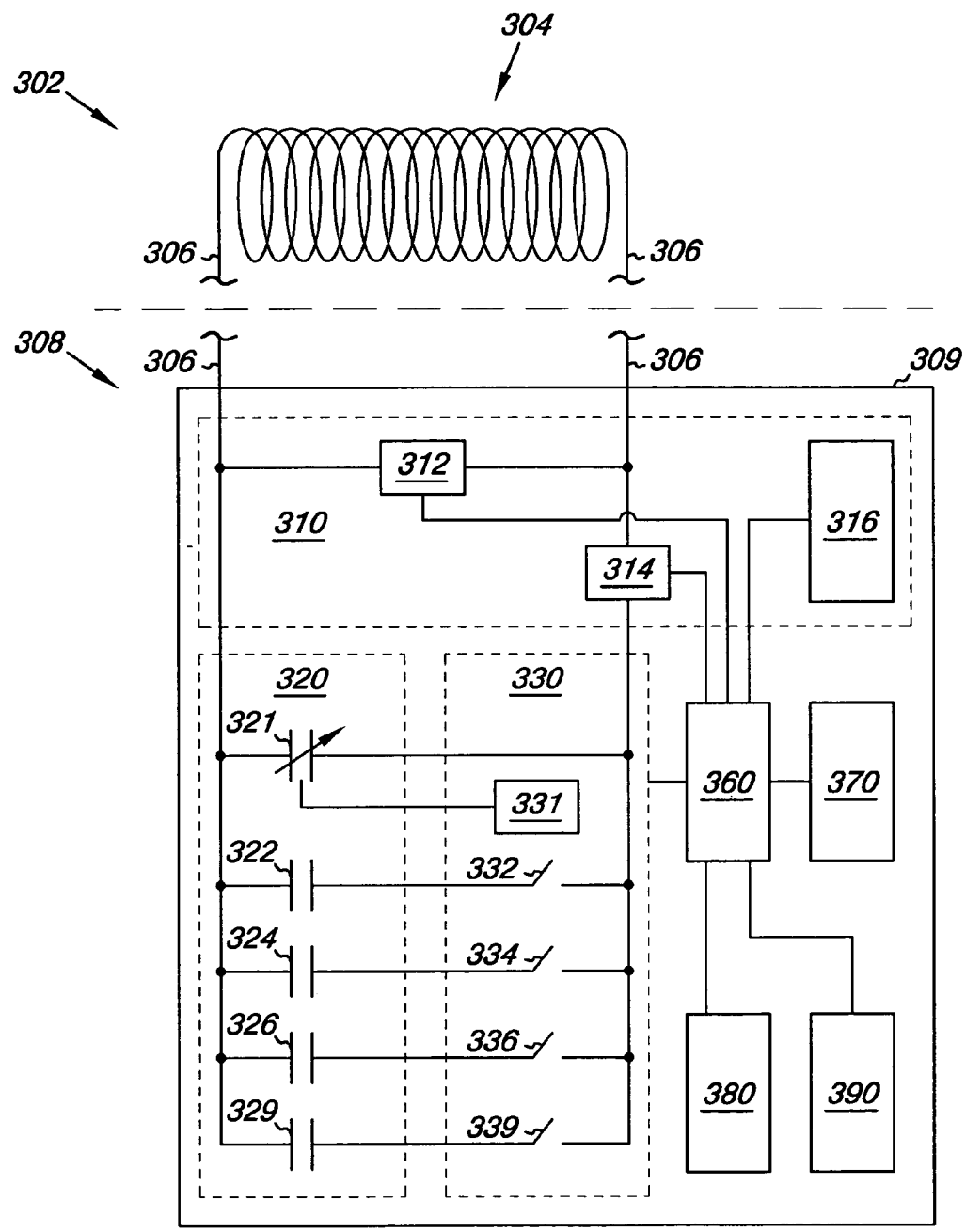
FIG. 3B illustrates another embodiment of a resonator device with an adjustable capacitance according to the present disclosure.

FIG. 3B illustrates another embodiment of a resonator device with an adjustable capacitance according to the present disclosure. The embodiment of FIG. 3B is a specific embodiment of FIG. 3A and includes elements corresponding with elements of the embodiment of FIG. 3A. In FIG. 3B the resonator device 302 includes the inductor coil 304, the connecting conductors 306, and the circuit package 308. As with FIG. 3A, the sizes of elements in FIG. 3B are merely illustrative and are not intended to indicate any particular size or relationship of size.

The inductor coil 304 is external to the circuit package 308, in the resonator device 302. The circuit package 308 encapsulates electrical components, including the sensors 310, the adjustable capacitance 320, and the adjustable capacitance control 330. The inductor coil 304, the connecting conductors 306, at least a portion of the adjustable capacitance 320, and at least a portion of the adjustable capacitance control 330 together form an LC resonator circuit. The circuit package also encapsulates a processor 360, a memory, 370, a power source 380, and a selector 390, which relate to the LC resonator circuit, as described herein.

In the resonator device 302 of FIG. 3B, the adjustable capacitance 320 includes a varactor 321, and capacitors 322, 324, 326, and 329. The varactor 321, and the capacitors 322, 324, 326, and 329 are electrically connected parallel to each other. The adjustable capacitance 320 can have different particular capacitance values based on the capacitance value of the varactor 321, the capacitance values of the capacitors 322, 324, 326, and 329, and the adjustable capacitance control 330, as described herein.

The adjustable capacitance 320, as a whole, is electrically in series with the inductor coil 304. One side of the inductor coil 304 is electrically connected to one side of the adjustable capacitance 320 through one of the connecting conductors 306. Another side of the inductor coil 304 is electrically connected to another side of the adjustable capacitance 320 through another of the connecting conductors 306 and through the adjustable capacitance control 330. Thus, while the varactor 321, and the capacitors 322, 324, 326, and 329 are electrically parallel to each other, the adjustable capacitance 320, with its particular capacitance value, is electrically in series with the inductor coil 304. In other words, the inductor coil 304 and the adjustable capacitance 320 respectively form L and C components of the LC resonator circuit, as will be understood by one of ordinary skill in the art. The adjustable capacitance 320 is electrically connected to the adjustable capacitance control 330.

In the resonator device 302, the adjustable capacitance control 330 includes a varactor controller 331, and electrical switches 332, 334, 336, and 339. The varactor controller 331 controls an adjustable capacitance of the varactor 321. Each of the electrical switches 332, 334, 336, and 339 has an open state and a closed state. In the closed state, an electrical switch forms an electrical connection that allows electrical current to flow through that switch. In the open state, an electrical switch forms an electrical break that prevents electrical current from flowing through that switch. Each of the electrical switches of FIG. 3B is shown in the open state, so the locations of the switches can be clearly identified.

In the embodiment of FIG. 3B, there is an electrical switch for each of the capacitors 322, 324, 326, and 329. The electrical switches 332, 334, 336, and 339 correspond with the capacitors 322, 324, 326, and 329. Thus, each electrical switch can connect its corresponding capacitor to the LC resonator circuit or disconnect its corresponding capacitor from the LC resonator circuit, depending on the state of the switch. For example, if the electrical switch 332 is in its closed state, it connects the capacitor 322 to the LC resonator circuit. Alternatively, if the electrical switch 332 is in its open state, then the capacitor 322 is disconnected from the LC resonator circuit. Since the capacitors 322, 324, 326, and 329 are electrically parallel to each other, each electrical switch can connect or disconnect its corresponding capacitor individually. As a result, the adjustable capacitance 320, as a whole, can be adjusted to different particular capacitance values depending on which capacitors are connected to the LC resonator circuit. In the embodiment shown, the LC resonator circuit is electrically connected to some of the sensors 310.

In the resonator device 302 of FIG. 3B, the sensors 310 include a voltage sensor 312, a current sensor 314, and a flux sensor 316. In this embodiment, some of the sensors 310 are electrically connected to the LC resonator circuit and each of the sensors 310 are connected to the processor 360. The voltage sensor 312 is electrically connected across the adjustable capacitance 312 and can sense an electrical voltage differential across the adjustable capacitance 312. The voltage sensor 312 is also connected to the processor 360 and can transmit a signal that represents a sensed voltage through that connection to the processor 360. The current sensor 314 is electrically connected in line with a path of the LC resonator circuit and can sense an electrical current flow through the path of the LC resonator circuit. The current sensor 314 is also connected to the processor 360 and can transmit a signal that represents a sensed current through that connection to the processor 360. The flux sensor 316 can sense a flux of a magnetic field, such as a flux of a static magnetic field from an MRI machine. The flux sensor 316 is also connected to the processor 360 and can transmit a signal that represents a sensed flux through that connection to the processor 360.

In the embodiment of FIG. 3B, the processor 360 is connected to the LC resonator circuit through the adjustable capacitance control 330. The processor 360 can execute logic and/or program instructions that allow it to perform functions, including a function of adjusting the adjustable capacitance 320 by directing the adjustable capacitance control 330. The processor 360 directs the adjustable capacitance control 330 to control the adjustable capacitance 320 to obtain different particular capacitance values. Specifically, the processor 360 directs the adjustable capacitance control 330 to open or close particular electrical switches which connect or disconnect particular capacitors, to obtain different particular capacitance values in the LC resonator circuit. Additionally, the processor 360 directs the varactor controller 331 to control the adjustable capacitance of the varactor 321, to obtain different particular capacitance values in the LC resonator circuit. Since the processor 360 directs the adjustable capacitance control 330, in various embodiments, the processor 360 can also be considered as part of the adjustable capacitance control 330. For simplicity, FIG. 3B shows a connection between the processor 360 and the adjustable capacitance control 330, as a whole, but does not show individual control connections for elements of the adjustable capacitance control 330.

The processor 360 is also connected to the memory 370, in the resonator device 302. The memory 370 can store data such as logic and/or program instructions and/or values. The processor 360 can transmit such data to the memory 370 and receive such data from the memory 370 through its connection to the memory 370. The processor 360 can use data stored in the memory 370 to perform functions. For example, the memory 370 can store program instructions that the processor 360 can use to direct the adjustable capacitance control 330 to adjust the adjustable capacitance 320 of the LC resonator circuit to a resonant capacitance in a magnetic field, as described herein. The memory 370 can store values that represent signals that the processor 360 receives from one or more of the sensors 310. For example, the memory 370 can store values that represent an electrical voltage differential across the adjustable capacitance 312, as sensed by the voltage sensor 312. The memory 370 can also store known values, such as a known inductance of the LC resonator circuit, including an inductance of the inductor coil 304.

The processor 360 is also connected to the power source 380 and the selector 390. The power source 380 provides the processor 360 with electrical power so the processor 360 can perform its functions, as described in FIG. 2. The selector 390 can be set to different settings, which represent various user inputs, as described herein. The processor 360 can detect the different settings of the selector 390 through its connection to the selector 390.

In one embodiment, the processor 360 of FIG. 3B automatically adjusts the adjustable capacitance 320 of the LC resonator circuit to a resonant capacitance, in response to a flux from a magnetic field. The processor 360 performs this automatic adjustment by determining a resonant capacitance and then adjusting the adjustable capacitance 320 to the resonant capacitance. As described herein, the resonant capacitance is a capacitance at which the LC resonator circuit will resonate in response to an RF pulse of an MRI machine, as will be understood by one of ordinary skill in the art. The processor 360 can adjust the adjustable capacitance 320 to the resonant capacitance by directing the adjustable capacitance control 330 to change a number of the parallel capacitors 322, 324, 326, and 329 that are connected to the LC resonator circuit and/or to adjust a capacitance of the varactor 321. The processor 360 directs this adjustment in various ways by executing logic and/or program instructions in response to known, sensed, and/or calculated values.

The processor 360 can direct the adjustment of the adjustable capacitance 320 of the LC resonator circuit to a resonant capacitance by executing logic and/or program instructions in response to known, sensed, and/or calculated values for a flux of a magnetic field and an inductance of the LC resonator circuit. Known values can be provided to the processor 360 from the memory 370, from the selector 390, or from directing the adjustable capacitance 310 to adjust to a known capacitance. The flux sensor 316 can sense a flux of a magnetic field, such as a flux of a static magnetic field from an MRI machine. In various embodiments of the present disclosure, flux values, inductance values, and capacitance values can be calculated as described herein.

In one embodiment of FIG. 3B, the processor 360 can execute logic and/or program instructions to direct the adjustment of the adjustable capacitance 320 of the LC resonator circuit to a resonant capacitance in response to a known or sensed flux of a particular magnetic field and a known inductance of the circuit. For example, if the processor 360 receives a signal from the flux sensor 316 that the particular magnetic field has a flux of 1.5 Teslas then the processor 360 can use a Larmor frequency formula, as described herein, to determine that the particular magnetic field has a Larmor frequency of 64 MHz. Further, in this example, if the LC resonator circuit has a known inductance of 0.69 microHenries, which can be known, for example, based on a known configuration of the inductor of the LC resonator circuit, then the processor can use the LC circuit resonance formula to determine that the resonant capacitance for that circuit is 8.9 picoFarads. Finally, in this example, in response to the known flux of a particular magnetic field and a known inductance of the circuit the processor can then direct the adjustable capacitance control 330 to adjust the adjustable capacitance 320 to 8.9 picoFarads.

The processor 360 can also direct the adjustment of the adjustable capacitance 320 of the LC resonator circuit to a resonant capacitance by executing logic and/or program instructions in response to sensed voltages across the adjustable capacitance 320 and/or sensed currents through the resonator circuit, for particular magnetic fields. For example, for a particular magnetic field, the processor 360 can direct the adjustable capacitance 320 to adjust to a particular capacitance, receive a signal from the voltage sensor 312 that represents a sensed voltage across the adjustable capacitance 320, and repeat this adjusting and sensing to determine a resonant capacitance at which a voltage across the adjustable capacitance 320 is a maximum voltage that can be obtained across the adjustable capacitance 320 in that particular magnetic field. In an alternative example, the processor 360 can perform a similar adjusting and sensing using a signal from the current sensor 314 to determine a resonant capacitance at a maximum current that can be obtained through the resonator circuit in a particular magnetic field. For these examples, the processor 360 can store sensed values in the memory 370, as necessary. The processor 360 can also repeat the adjusting of the adjustable capacitance 320 by adjusting through all possible capacitance values, by performing a bracketing approach, or by using some other technique.

In various embodiments of the present disclosure, a resonant capacitance for the LC resonator circuit of the resonator device 302 of FIG. 3B can be determined in other ways. In one embodiment, the adjustable capacitance 320 can be adjusted to a known capacitance, an inductance of the LC resonator circuit can be calculated, and a resonant capacitance for the LC resonator circuit can also be calculated, based on a known or sensed flux value and the calculated inductance. The inductance of the LC resonator circuit can be calculated by using various general circuitry formulas such as Kirchoff's voltage law, Kirchoff's current law, and other defined relationships for resistance, reactance, impedance, and frequency response for LC circuits, as will be understood by one of ordinary skill in the art. In another embodiment, a resonant capacitance for the LC resonator circuit can be determined from a frequency response of the LC resonator circuit as sensed by the voltage sensor 312, the current sensor 314, and/or another type of sensor.

Various embodiments of the inductor coil 304 of the resonator device 302 of FIG. 3B can be made as described herein. In one embodiment, the inductor coil 304 can be a commercially available inductor coil with a number of windings, a radius, and a length chosen to suit a particular application. In another embodiment, the inductor coil 304 can be fabricated from a flexible conductive material, such as copper or a copper alloy, with an adjustable radius, such as a radius that can increase when used with an expandable stent. In various other embodiments of FIG. 3B, more than one inductor coil can be used in the LC resonator circuit. In an alternate embodiment of the present disclosure, a core inductor can be used in place of an inductor coil.

Various embodiments of the adjustable capacitance 320 of the resonator device 302 of FIG. 3B can also be made as described herein. In one embodiment, the adjustable capacitance 320 can include the varactor 320, which is sized to have a range similar to a lower end of a range of estimated adjustable capacitance. For example, if a lower end of a range of estimated adjustable capacitance is 0.41 picoFarads, as described in FIG. 3A, then the varactor 320 can have a capacitance range of 1 picoFarad.

In various embodiments of the resonator device 302, capacitors in the adjustable capacitance 320 can be of increasing size, to provide for a continuous range of possible capacitance. For example, in one embodiment of the present disclosure, the adjustable capacitance 320 can include a varactor with a 1 picoFarad adjustable capacitance, and capacitors with values of 1, 2, 4, 8, 16, 32, 64, 128, 256, 512, 1012, 2048, and 4096 picoFarads. Using combinations of capacitors in this example can provide adjustable capacitance values from zero Farads to 8.2 nanoFarads, which is a sufficient range to provide resonant capacitance in a resonator device for MRI from 1.5 to 3.0 Teslas and inductor coil inductances from 0.79 nanoHenries to 0.69 microHenries, as described herein. In various embodiments, the adjustable capacitance 320 can also include various other combinations of capacitors. Although the embodiment of FIG. 3B shows one varactor and four capacitors in parallel, other numbers of varactors and/or capacitors can be used, in various embodiments of the present disclosure. Additionally, resistors and other electrical components can be added to the LC resonator circuit of the resonator device 302 to provide different resonant frequency responses, as will be understood by one of ordinary skill in the art.

Figure 4A:
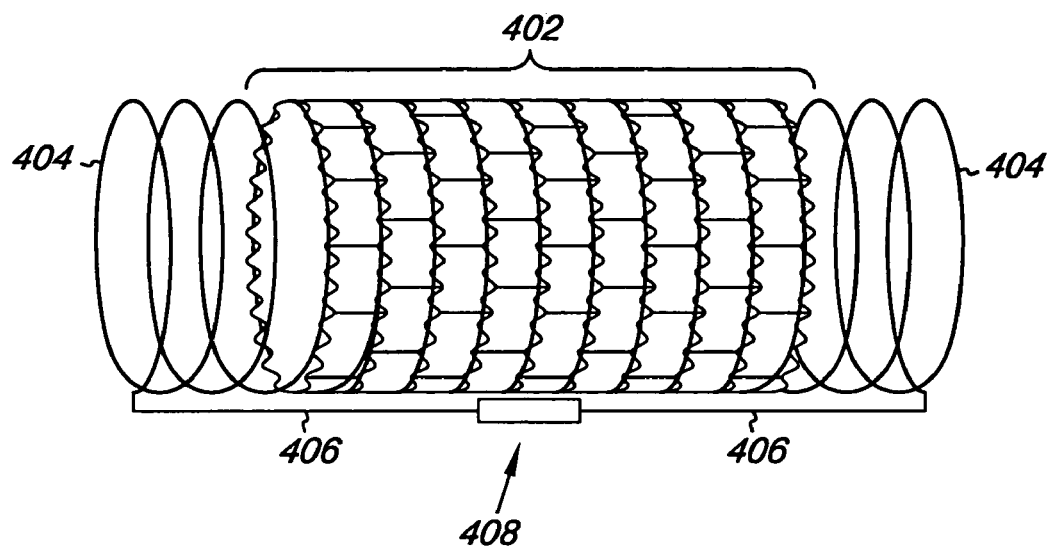
FIG. 4A illustrates an embodiment of a resonator system with a medical device according to the present disclosure.

FIG. 4A illustrates an embodiment of a resonator system with a medical device according to the present disclosure. The system embodiment of FIG. 4A includes a stent 402, and a resonator device including an inductor coil 404, connecting conductors 406 and a circuit package 408. In the embodiment shown in FIG. 4, the inductor coil 404 surrounds the stent 402 and extends beyond both ends of the stent 402. In various embodiments, the inductor coil 404 can relate to an implantable medical device, such as the stent 404, in various ways. In one embodiment, a portion of the inductor coil 404 can surround a space that is surrounded by at least a portion of a medical device. For example, a portion of the inductor coil 404 can surround a portion of a passageway of a stent. In another embodiment, a portion of the inductor coil 404 can surround the medical device.

As in FIGS. 3A and 3B, electrical components encapsulated by the circuit package 408 include sensors, an adjustable capacitance, an adjustable capacitance control, a processor, a memory, a power source, and a selector. The inductor coil 404, the connecting conductors 406, at least a portion of the adjustable capacitance, and a portion of the adjustable capacitance control together form an LC resonator circuit. In this embodiment, the processor automatically adjusts the adjustable capacitance of the LC resonator circuit to a resonant capacitance, in response to a flux from a magnetic field, as described in FIGS. 3A and 3B. Thus, the system embodiment of FIG. 4A can resonate over a range of MRI frequencies, enhancing the visualization of the stent 402, when performing MRI.

Figure 4B:
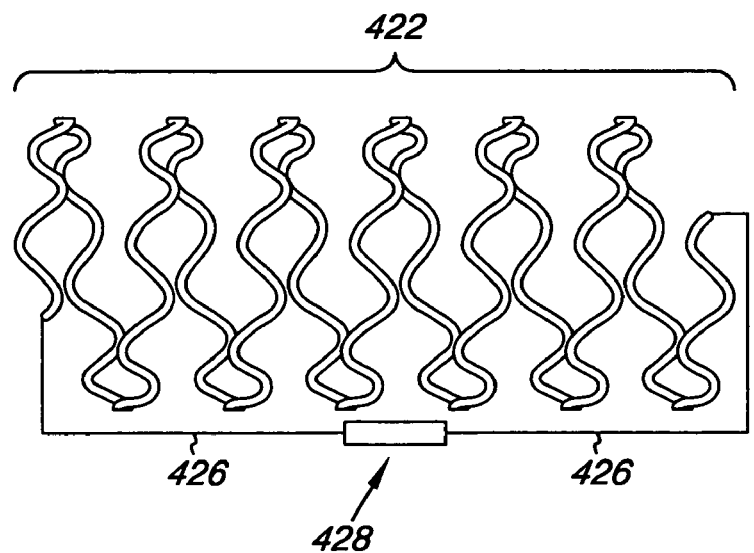
FIG. 4B illustrates another embodiment of a resonator system with a medical device according to the present disclosure.

FIG. 4B illustrates another embodiment of a resonator system with a medical device according to the present disclosure. The system embodiment of FIG. 4B includes a stent with a meandering coil 422, connecting conductors 426 and a circuit package 428. As in FIGS. 3A and 3B, electrical components encapsulated by the circuit package 428 include sensors, an adjustable capacitance, an adjustable capacitance control, a processor, a memory, a power source, and a selector. The meandering coil of the stent 422, the connecting conductors 406, at least a portion of the adjustable capacitance, and a portion of the adjustable capacitance control together form an LC resonator circuit, with the meandering coil of the stent 422 forming the L component of the LC resonator circuit. In this embodiment, the processor automatically adjusts the adjustable capacitance of the LC resonator circuit to a resonant capacitance, in response to a flux from a magnetic field, as described in FIGS. 3A and 3B. Thus, the system embodiment of FIG. 4A can resonate over a range of MRI frequencies and stent diameters, enhancing the visualization of the stent 422, when performing MRI. Similarly, a resonator system can be made with other implantable medical devices such as a graft, a shunt, and a vena cava filter, as will be understood by one of ordinary skill in the art.

Figure 5:
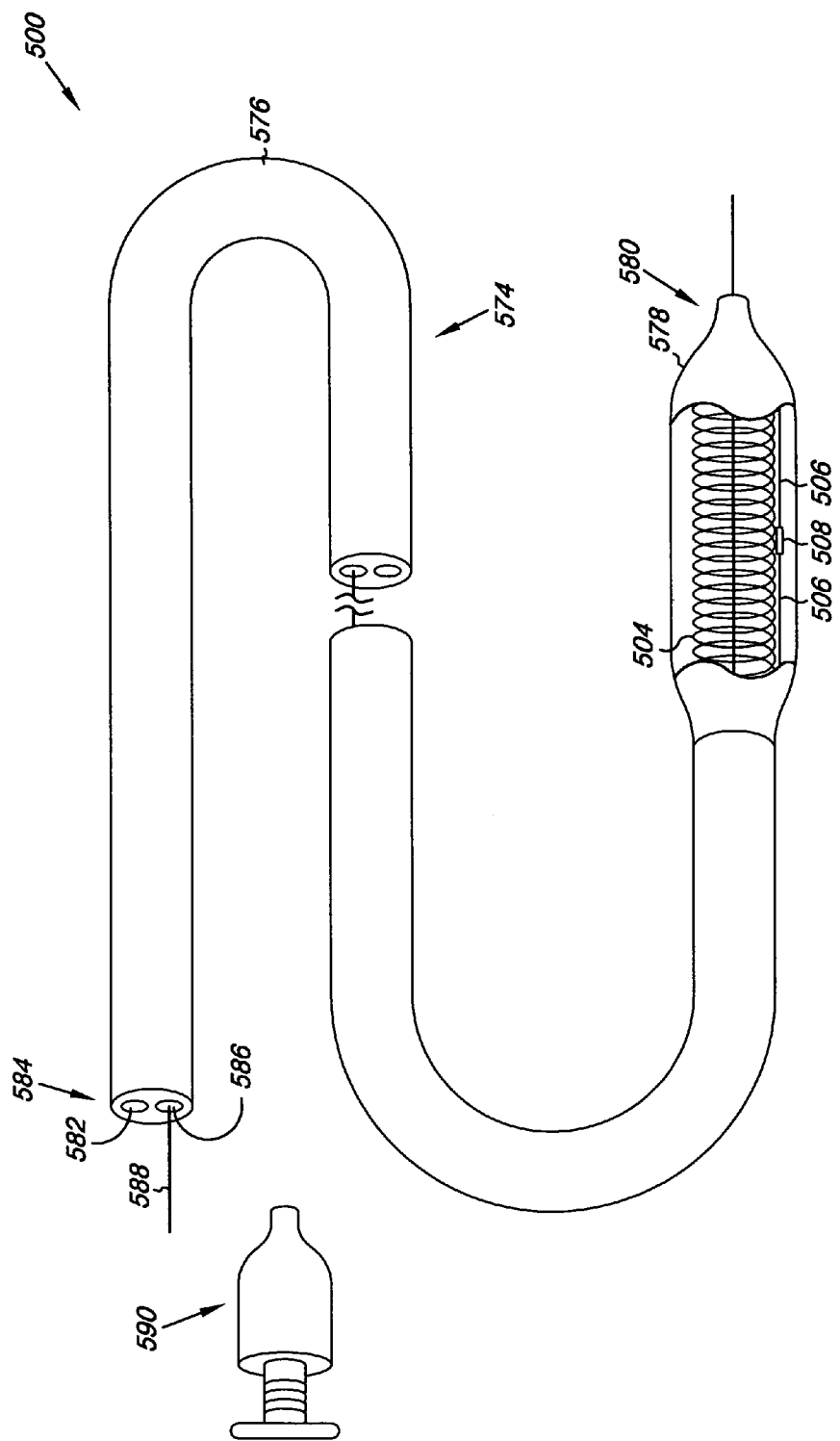
FIG. 5 illustrates still another embodiment of a resonator system with a medical device according to the present disclosure.

FIG. 5 illustrates another embodiment of a resonator system with a medical device according to the present disclosure. The resonator system 500 of FIG. 5 includes an inductor coil 504, connecting conductors 506 and a circuit package 508. As in FIGS. 3A and 3B, electrical components encapsulated by the circuit package 508 include sensors, an adjustable capacitance, an adjustable capacitance control, a processor, a memory, a power source, and a selector. The inductor coil 504, the connecting conductors 506, a portion of the adjustable capacitance, and a portion of the adjustable capacitance control together form an LC resonator circuit. In this embodiment, the processor automatically adjusts the adjustable capacitance of the LC resonator circuit to a resonant capacitance, in response to a flux from a magnetic field, as described in FIGS. 3A and 3B. Thus, the system embodiment of FIG. 5 can resonate over a range of MRI frequencies, enhancing the visualization of a distal end 580 of a catheter 574, when performing MRI.

FIG. 5 also illustrates the catheter 574 with an elongate body 576, an inflatable balloon 578 positioned adjacent the distal end 580, and a lumen 582 longitudinally extending in the elongate body 576 of the catheter 574 from the inflatable balloon 578 to a proximal end 584. The catheter 574 can further include a guidewire lumen 586 to receive a guidewire 588. The inflatable balloon 578 can be inflated through the use of an inflation pump 590 that can releasably couple to a lumen 582. In various embodiments, the inductor coil 504 can placed inside a temporarily implantable medical device, such as the catheter 574, in various ways. In one embodiment, the inductor coil 504 can be connected to a temporarily implantable medical device. The resonator system 500 of FIG. 5 can be used with various temporarily implantable medical devices, such as a guiding catheter, a guiding wire, a catheter for stent delivery, or a catheter for dilation without a stent.

As discussed herein, embodiments of a resonator device or system can also be implanted into a body. As will be understood by one of ordinary skill in the art, a variety of procedures can be used to implant an embodiment of a resonator device or system with an implantable medical device. For example, certain embodiments of a resonator device can be implanted adjacent to a stent that has already been implanted in a body. Alternatively, both a stent and certain embodiments of a resonator device can be implanted simultaneously. For example, both a stent and a resonator device could be loaded onto a catheter (e.g., a balloon catheter) for implanting in a body. In various embodiments of the present disclosure a medical device can be a deliverable device, deliverable in a lumen of a body.

In the foregoing Detailed Description, various features are grouped together in several embodiments for the purpose of streamlining the disclosure. This method of disclosure is not to be interpreted as reflecting an intention that the embodiments of the disclosure require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A resonator system for detecting a deliverable device in a body, comprising:
   a resonator device with an LC resonator circuit, including:
      an inductor coil
      a plurality of individually switched parallel capacitors in series with the inductor coil;
      a varactor in parallel with the plurality of individually switched parallel capacitors;
      a processor coupled to the plurality of individually switched parallel capacitors;
      a magnetic flux sensor coupled to the processor, where the magnetic flux sensor can sense a flux of a magnetic field and transmit a signal that represents the flux to the processor that changes the capacitance of the LC resonator circuit by switching a number of the plurality of individually switched parallel capacitors based on the signal;
      a power source electrically connected to the processor; and
   a deliverable device, positioned with the resonator device, so that at least a portion of the inductor coil surrounds a space that is surrounded by at least a portion of the deliverable device.

2. The resonator system of claim 1, where:
   the deliverable device is an implantable medical device; and
   the power source can generate electrical power from a field for use by the processor, where the field is selected from the group including:
      an electro-magnetic field; and
      an alternating magnetic field.

3. The resonator system of claim 2, wherein the resonator device includes a current sensor that can sense an electrical current flow through a path of the LC resonator circuit.

4. The resonator system of claim 2, where the resonator device includes a voltage sensor that can sense an electrical voltage differential across the plurality of individually switched parallel capacitors.

5. The resonator system of claim 2, wherein:
   at least a portion of the inductor coil has an adjustable radius; and
   at least a portion of the inductor coil surrounds at least a portion of a passageway of the implantable medical device.

6. The resonator system of claim 5, wherein the implantable medical device is a permanently implantable medical device selected from the group including:
   a balloon expandable stent;
   a self-expandable stent;
   a graft;
   a shunt; and
   a vena cava filter.

7. The resonator system of claim 5, wherein the implantable medical device is a temporarily implantable medical device selected from the group including:
   a guiding catheter;
   a guiding wire;
   a catheter for stent delivery; and
   a catheter for dilation without a stent.

8. The resonator system of claim 1, wherein:
   the implantable medical device is a temporarily implantable medical device; and
   the resonator device is inside the temporarily implantable medical device.

9. A resonator system, comprising:
   a resonator circuit that includes an inductor coil in series with a plurality of individually switched parallel capacitors;
   a varactor that is:
      parallel to the plurality of individually switched parallel capacitors; and
      connectable to the resonator circuit
   a processor coupled to the resonator circuit,
   a power source electrically connected to the processor;
   a magnetic flux sensor coupled to the processor, where the magnetic flux sensor can sense a flux from a magnetic field and transmit a signal based on the flux to the processor that automatically adjusts the capacitance to a resonant capacitance by switching a number of the plurality of individually switched parallel capacitors; and
   an implantable medical device, wherein at least a portion of the implantable medical device is surrounded by the inductor coil.

10. The resonator system of claim 9, including a selector that manually adjusts the capacitance, at least in part, by changing a number of the plurality of individually switched parallel capacitors that are connected to the resonator circuit.

11. The resonator system of claim 9, where:
   the resonator circuit includes capacitors that are:
      in parallel; and
      connectable to the resonator circuit; and
   the processor automatically adjusts the capacitance, at least in part, by changing a number of the plurality of individually switched parallel capacitors that are connected to the resonator circuit.

12. The resonator system of claim 11, where:
   the processor automatically adjusts the capacitance, at least in part, by adjusting a capacitance of the varactor.

13. The resonator system of claim 9, including a sensor:
connected to a the processor; and
selected from the group including:
- a voltage sensor connected across the plurality of individually switched parallel capacitors; and
- a current sensor connected in line with a path of the resonator circuit.

14. The resonator system of claim 9, wherein the power source is selected from the group including:
the inductor coil;
a coil;
a battery;
a capacitor; and
a secondary resonator circuit.

15. A method comprising:
providing a resonator circuit with:
- an inductor coil in series with a plurality of individually switched parallel capacitors;
- a processor which is coupled to the resonator circuit to change a capacitance of the resonator circuit;
- a power source connected to the processor; and
- a magnetic flux sensor coupled to the processor, where the magnetic flux sensor can sense a flux of a magnetic field and transmit a signal that represents the flux to the processor that changes the capacitance of the LC resonator circuit by switching a number of the plurality of individually switched parallel capacitors based on the signal, to a deliverable device, deliverable in a lumen of a body, so that at least a portion of the inductor coil surrounds at least a portion of the deliverable device;

determining a resonant capacitance at which the resonator circuit will resonate in a particular magnetic field by:
sensing a flux of the particular magnetic field; and
calculating the resonant capacitance of the resonator circuit, based on the sensed flux and a known inductance of the resonator circuit; and
adjusting the capacitance of the resonator circuit to the resonant capacitance in the lumen.

16. A method comprising:
fabricating a resonator device that includes:
- a resonator circuit with an inductor coil in series with a plurality of individually switched parallel capacitors;
- a varactor that is:
  - parallel to the plurality of individually switched parallel capacitors; and
  - connectable to the resonator circuit:
- a processor that can automatically adjust a capacitance to a resonant capacitance in response to magnetic fields of different strength;
- a power source connected to the processor;
- a magnetic flux sensor coupled to the processor, where the magnetic flux sensor can sense a flux of a magnetic field and transmit a signal that represents the flux to the processor that changes the capacitance of the LC resonator circuit by switching a number of the plurality of individually switched parallel capacitors based on the signal; and connecting the resonator device to a medical device so that at least a portion of the inductor coil surrounds at least a portion of the medical device.

17. The method of claim 16 wherein:
fabricating the resonator device includes fabricating an inductor coil out of a flexible conductive material so that the coil has an adjustable radius; and
connecting the resonator includes securing the inductor coil around a stent so that the adjustable radius can increase as the stent expands.

18. The method of claim 16, wherein connecting the resonator includes securing the resonator device in a distal end of a catheter.

19. The method of claim 16, wherein the processor automatically adjusts the capacitance to a resonant capacitance by:
adjusting the capacitance to a known capacitance;
calculating an inductance of the resonator circuit, based on the known capacitance and the sensed flux of the magnetic field; and
calculating the resonant capacitance of the resonator circuit, based on the sensed flux and the calculated inductance of the resonator circuit.

20. The method of claim 16, wherein the processor automatically adjusts the capacitance to a resonant capacitance by:
adjusting the capacitance to a particular capacitance;
sensing a voltage across the capacitance; and
repeating the adjusting and the sensing to determine a particular capacitance at which the voltage across the capacitance is a maximum voltage that can be obtained by the capacitance in the particular magnetic field.

21. The method of claim 16, wherein the processor automatically adjusts the capacitance to a resonant capacitance by:
adjusting the capacitance to a particular capacitance;
sensing a current through the resonator circuit at the particular capacitance; and
repeating the adjusting and the sensing to determine a particular capacitance at which the current through the resonator circuit is a maximum current that can be obtained by the capacitance in the particular magnetic field.

* * * * *